United States Patent [19]

Frosien et al.

[11] Patent Number: 4,675,524
[45] Date of Patent: Jun. 23, 1987

[54] SCANNING PARTICLE MICROSCOPE WITH DIMINISHED BOERSCH EFFECT

[75] Inventors: Juergen Frosien, Ottobrunn; Rainer Spehr, Ober-Ramstadt, both of Fed. Rep. of Germany

[73] Assignee: Siemens Aktiengesellschaft, Berlin and Munich, Fed. Rep. of Germany

[21] Appl. No.: 831,730

[22] Filed: Feb. 21, 1986

[30] Foreign Application Priority Data

Mar. 11, 1985 [DE] Fed. Rep. of Germany ....... 3508609

[51] Int. Cl.$^4$ ..................... H01J 37/256; H01J 37/28
[52] U.S. Cl. .................................. 250/310; 250/309; 250/311
[58] Field of Search ..................... 250/310, 311, 309; 315/382, 16

[56] References Cited

U.S. PATENT DOCUMENTS

3,691,377 9/1972 Matsui et al. ................... 250/311
4,330,707 5/1982 Manzke .......................... 250/310

Primary Examiner—Craig E. Church
Assistant Examiner—Jack I. Berman
Attorney, Agent, or Firm—Hill, Van Santen, Steadman & Simpson

[57] ABSTRACT

A beam generator in a scanning particle microscope reduces energetic Boersch effect on the probe diameter to improve resolution by enabling beam particles to traverse a first beam crossover point with low energy and subsequently reaccelerating the beam particles to high energies while traversing the microscope's electro-optical column for subsequent deceleration shortly before reaching a specimen. An extraction electrode is provided between a Wehnelt electrode and an anode at a positive potential relative to a cathode, wherein the positive potential of the extraction electrode is substantially less than a positive potential at the anode.

20 Claims, 6 Drawing Figures

SCANNING PARTICLE MICROSCOPE WITH DIMINISHED BOERSCH EFFECT

BACKGROUND OF THE INVENTION

The present invention relates generally to a scanning particle microscope and, more specifically, to an electrode arrangement in the particle beam source.

Scanning electron microscopes are being employed to an increasing degree in the semiconductor industry in the manufacture and development of micro-electronic components. For example, the individual process steps involved in the manufacture of large scale integrated (LSI) circuits can be monitored, masks and wafers can be inspected, or microstructures can be generated on a subject by electron beam lithography. Scanning electron microscopes are also used for checking electrical properties of large scale integrated circuits. By measuring the time variations in the voltage at selected circuit nodes, errors in the structure of the components under investigation can be recognized and eliminated early in the design phase.

To avoid errors during voltage measurements with scanning electron microscopes, care must be taken not to charge the surfaces of the components, which are usually disposed on an insulated carrier substrate for the duration of the measurement. Therefore, during mensurational applications, the primary electron current incident on a component must be substantially equal to the current of the secondary and backscatter electrons being emitted from it.

Such condition is met when the primary energy of the electrons coincides with a neutral energy point. The neutral energy point is material-dependent and is relatively low, typically within the range of 0.5–2.5 keV. Use of such low-energy electrons in measurement applications offers the further advantage of load-free and damage-free testing of radiation-sensitive components, such as, MOS memory units.

In electron beam lithography where microstructures are currently being generated with high energy electrons, the use of significantly lower primary electron energies will have to be utilized to improve resolution.

Thus, there is an increasing need for efficient low-voltage scanning electron microscopes in all areas of semiconductor technology for rapid and high-resolution investigation of LSI components. Conventional scanning electron microscopes having low acceleration voltages can only be used to a limited extent for such purposes, since the available resolution is poor and the probe current on the specimen surface is considerably diminished.

The reason for such characteristics is a result of electron-electron interaction which opposes the focusing of the electron beam. Electron beam expansion is a consequence of the Boersch effect which is a particular problem in electron sources that generate highly directional beams such as, for example, lanthanum hexaboride single crystal cathodes, as a result of which fine electron probes with high current densities cannot be generated solely with low accelerating voltages.

The smallest achievable probe diameters on a specimen is limited by two fundamentally different effects. Firstly, lateral Boersch effect is a result of the Coulomb repulsion between electrons along the entire beam path which increases their mean spatial distance, and consequently, the beam diameter. Secondly, the energetic Boersch effect results from the electromagnetic interaction between electrons in regions of high current densities and, in particular, at beam crossing points. This second effect leads to a spread in energy distribution so that the probe diameter is indirectly enlarged by chromatic aberration of the objective lens.

Reference is made to pending U.S. Patent application Ser. No. 751,020, filed July 2, 1985, and based on German Patent application P 34 29 804.5, which proposes a scanning electron microscope with a diminished lateral Boersch effect. The lateral Boersch effect is diminished by first enabling electrons to traverse the electro-optical column of the scanning microscope at high potential and then, shortly before the electrons reach the specimen, decelerating the beam to a desired low energy. As a consequence of the high accelerating voltage, however, the width of the energy distribution of the electrons increases, particularly at the source beam crossing point, so that the reduced influence of the lateral Boersch effect on the probe diameter is at least partially cancelled by the increased energetic Boersch effect.

SUMMARY OF THE PRESENT INVENTION

It is an object of the present invention to provide a scanning electron microscope with a diminished lateral Boersch effect in the beam path and a diminished energetic Boersch effect in the beam generator. The above object is achieved in a scanning particle microscope in which the particles traverse the first beam crossover point at low energy and then are accelerated to high energies. The particles traverse the microscope's electro-optical column with high energies and are decelerated to a lower energy by a retarding means before reaching the specimen to be tested. The present scanning particle microscope has a beam generator having an extractional electrode between a Wehnelt electrode and an anode, wherein the anode is at a higher potential than the extraction electrode, as well as a means for decelerating the primary particles in the particle beam path prior to reaching the specimen. An advantage of the present invention is that, for low primary electron energies, the probe current for a given probe diameter is increased.

A scanning particle microscope according to the present invention may be used not only for generating electron beams but also for generating any desired type of ion beams.

DESCRIPTION OF THE PREFERRED EMBODIMENTS

Figure 1:
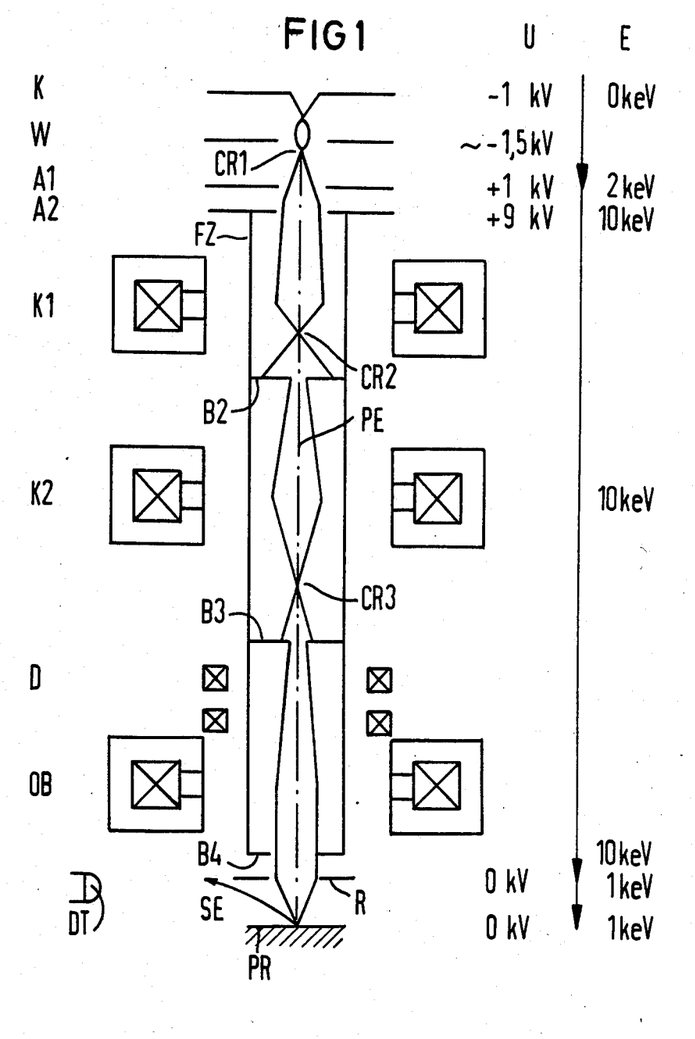
FIGS. 1–5 are schematic representations of scanning electron microscopes according to the present invention.

In FIG. 1, an electron-optical column of a scanning electron microscope is shown. Electrons are emitted by a cathode K and accelerated in the direction of an extraction electrode A1 and an anode A2 and are focused by a Wehnelt electrode W in a first beam crossover point CR1, also referred to as a source crossover. To generate a finely focused electron probe, the beam from the cathode K is demagnified by condenser lenses K1 and K2 and by an objective lens OB which electro-optically focuses the beam on a specimen. Upon traversing the magnetic fields of the individual lens systems, the paths of the electrons intersect in beam crossover points CR2 and CR3.

To improve the imaging properties of the electrooptical unit, aperture diaphragms B2, B3, and B4 are built into the beam path to blank electrons proceeding on paths remote from the beam axis. The beam current available at the specimen is considerably reduced by each of these diaphragms, B2, B3 and B4, so that, for example, the current density in the beam crossover point CR1 differs from the current density at beam crossover CR3 by several orders of magnitude. A primary electron beam PE is positioned on a specimen PR by electrostatic or magnetic deflection systems. Through the use of a suitable drive, coil pairs of a magnetic deflection system D, shown in FIG. 1, can be used to move the primary electron beam PE in line-wise fashion across the specimen PR or to position the electron beam PE at a selected point.

For the purpose of investigating a semiconductor component, such as an integrated circuit, by means of topography or voltage contrast, the scanning electron microscope is equipped with a detector system DT for documenting the secondary, or backscatter, electrons SE triggered on a specimen PR by the primary electron beam PE. The components of a beam blanking system for measuring high frequency signal curves in integrated circuits, as well as a voltage supply for the beam generator and for the magnetic lenses, are not shown for reasons of clarity.

Narrow limits are placed on the bundling of low-energy electron beams in conventional scanning electron microscopes, particularly for electron sources having a high directional beam value. This is the result of the Coulomb interaction between electrons which act on the overall beam length and lead to an expansion of the beam probe. The probe diameter D is defined by the equation $$D = (d_{geo}^2 + d_F^2)^{\frac{1}{2}}$$

and is, thus dependent on the square of the geometrical probe diameter $d_{geo}$ and on the chromatic aberration disk diameter $d_F$. The geometrical probe diameter $d_{geo}$ is defined as the expansion of the beam as a consequence of the Coulomb repulsion of the electrons in the beam path along the electro-optical column between the source and the specimen (lateral Boersch effect).

The electromagnetic interaction between electrons, however, does not only alter their mean three-dimensional spacing but also changes the width of their energy distribution. A spread of the energy distribution leads indirectly to a large probe diameter through the chromatic aberration of the objective lens. This contribution of the energetic Boersch effect to the probe diameter D is taken into consideration in the equation by the chromatic aberration disk diameter $d_F$.

As is known, the lateral Boersch effect is diminished when the electrons are allowed to traverse the electro-optical column with a high primary energy of, for example, 10 keV and are decelerated to the desired low ultimate energy of, for example, 1 keV shortly before they reach a specimen. Since the influence of the lateral Boersch effect on the probe diameter is reduced at high primary energies, this method is capable of noticeably increasing the current available on a specimen for a given probe diameter D. Recent calculations, however, have found that the width of the energy distribution of the electrons increases for high primary energies in the first part of a beam path. As a consequence of the high current density, the first beam crossover point CR1 generates a significant amount of the energy distribution change.

For example, in a scanning electron microscope S150 as manufactured by Cambridge Instruments, the half-width value of the energy distribution after traversing the source beam crossover point CR1 amounts to about 1.1 eV for beam currents of I=250 µA for primary electron energies of 1 keV. The half-width value of the energy distribution is increased to 2.2 eV for an initial acceleration of the electrons to 10 keV and subsequent deceleration to 1 keV. The contribution of the chromatic aberration to the probe diameter D, is thus increased in accordance with the above equation.

In the present invention, the energetic Boersch effect in the beam generator of a scanning electron microscope is noticeably reduced when the electrons are allowed to traverse the first beam crossover point CR1 with low beam energy. Since the influence of the energetic Boersch effect on the probe diameter is reduced at lower electron energies, the voltage difference between the cathode K and the extraction electrode A1 is to be as small as possible. However, the voltage difference must not fall below a minimum value, since an electron space charge which limits beam current would otherwise be built up in the region of the cathode K. A voltage difference of 2 kV between the cathode K and the extraction electrode A1 is a preferred value. With a 2 kV difference, the cathode supplies the maximum directional beam value and, simultaneously, the electron energy in the first beam crossover point CR1 is low enough to noticeably reduce the expansion in the beam PE as a consequence of the energetic Boersch effect.

By applying this principle to a scanning electron microscope of the Cambridge Instruments Company, the width of the energy distribution of the electrons is reduced by approximately 30% when an extraction voltage of 2 kV, an intermediate acceleration of the electrons to 10 keV, and an ultimate electron energy of 1 keV are provided.

After traversing the source crossover point CR1, the low-energy electrons are accelerated to high primary energies, for example 10 keV, by the field existing between the extraction electrode A1 and the anode A2 so as to reduce the influence of the lateral Boersch effect on the probe diameter in the following portion of the beam path. As is known, these high-energy electrons are then decelerated with the assistance of an electrostatic decelerating means R shortly before reaching the specimen. They are preferrably decelerated to an ultimate energy of 1 keV. Since the influence of the lateral Boersch effect increases with the length of the beam path traversed at low energies, the path length between the deceleration point and the specimen should be as short as possible. Thus, the position of the decelerating means R in the region of the objective lens OB as shown in FIG. 1 appears to be an optimum arrangement. Therefore, by providing the minimum distance between the decelerating point R and the specimen PR, the greatest possible gain can be accomplished in the directional beam value in comparison to the prior art.

It may be preferable to provide a plurality of decelerating means R, depending on the field of the application and the job to be accomplished. This depends, among other things, on how great the working distance between the specimen and the detector DT must be, on whether the function of the object under examination is deteriorated by high potentials present at of the decelerating devices R or on whether the decelerating devices R, should also have lens-like properties or be integrated into a magnetic lens.

The electron decelerating means R, in the simplest case, is composed of one or more electrodes charged with voltage(s). Net-shaped electrodes, or lattice electrodes, are particularly useful in some applications since they do not exhibit any lens effect when the elements forming the net or the lattice are relatively close to one another. Complex distributions of potential in the beam path are avoidable when two net-shaped electrodes are disposed immediately following one another and the last electrode in the beam direction is utilized as a retarding electrode. However, a single net-shaped electrode can also be used insofar as its complex distribution of potential is also taken into consideratioin in the design of the remaining electro-optical components. Fundamentally, any electrostatic retarding element, particularly two-electrode arrangements or multi-electrode arrangements, can be utilized for decelerating the electrons.

Diaphragms, cylindrical lenses, a single braking lens, or combinations thereof are employable as decelerating means R, which also may be used in combination with net-shaped or lattice electrodes. Electrostatic lenses can also be provided in addition to or instead of magnetic lenses. The provision of an electro-optical combination of electrostatic lenses with magnetic objective lenses, for example in the form of an electrostatic immersion object lens, offers further advantages.

The disadvantageous effects of the energetic Boersch effect is significantly reduced in the first low-energy portion of the beam path and the effects of the lateral Boersch effect are significantly reduced in the second high-energy portion of the beam path with the scanning electron microscope arrangement shown in FIGS. 1–5. In FIG. 1, when the voltages indicated are applied to the cathode K, the Wehnelt electrode W, the extraction electrode A1, the anode A2, and the decelerating devices R, the electrons traverse the first beam crossover point CR1 with an energy of 2 keV and are subsequently accelerated to approximately 10 keV. The electrons then traverse the electro-optical column with high primary energy and are retarded to the desired ultimate energy of 1 keV by the electrode arrangement R shortly before reaching the specimen PR, which lies at ground potential. When the electro-optical column is to be traversed with higher primary energies, only the voltage difference between the cathode and the anode is increased without modifying the voltage difference between the cathode and the extraction electrode.

For improved definition of the electron energies in the high-energy portion of the beam path, the electrons are guided through a hollow cylinder of non-ferrqmagnetic material at anode before the decelerating electrode R.

The present invention can also be applied to electron beam printers wherein the Boersch effect likewise limits the resolution. Since higher electron energies are used in such printers, the electrons must first be extracted from the cathode with a voltage of approximate 5 kV, must then be accelerated with about 50 kV and subsequently be retarded to the desired ultimate energy of, for example, 20 keV. It is also foreseen that the present invention can be applied to ion beam devices.

Figure 2:
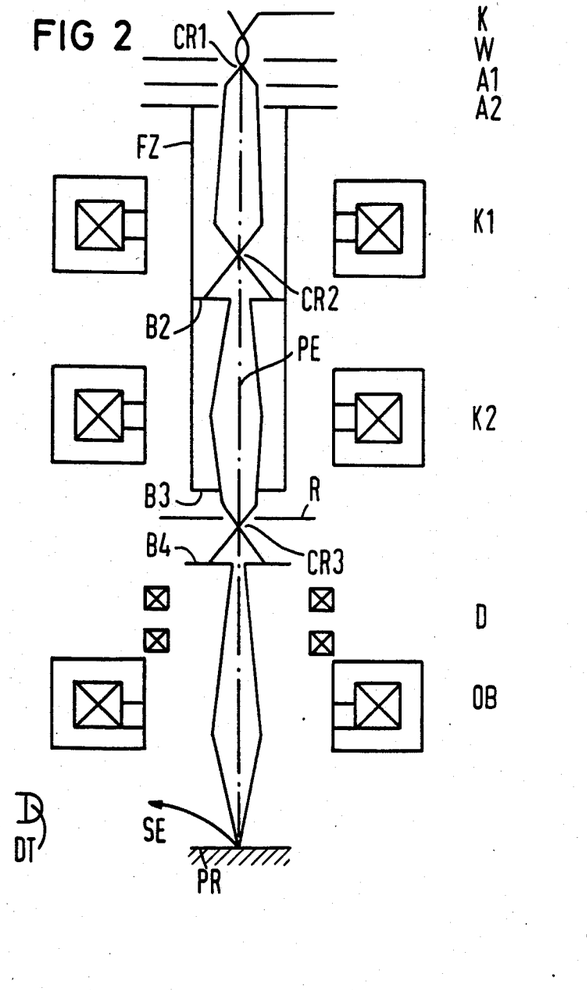
Figure 3:
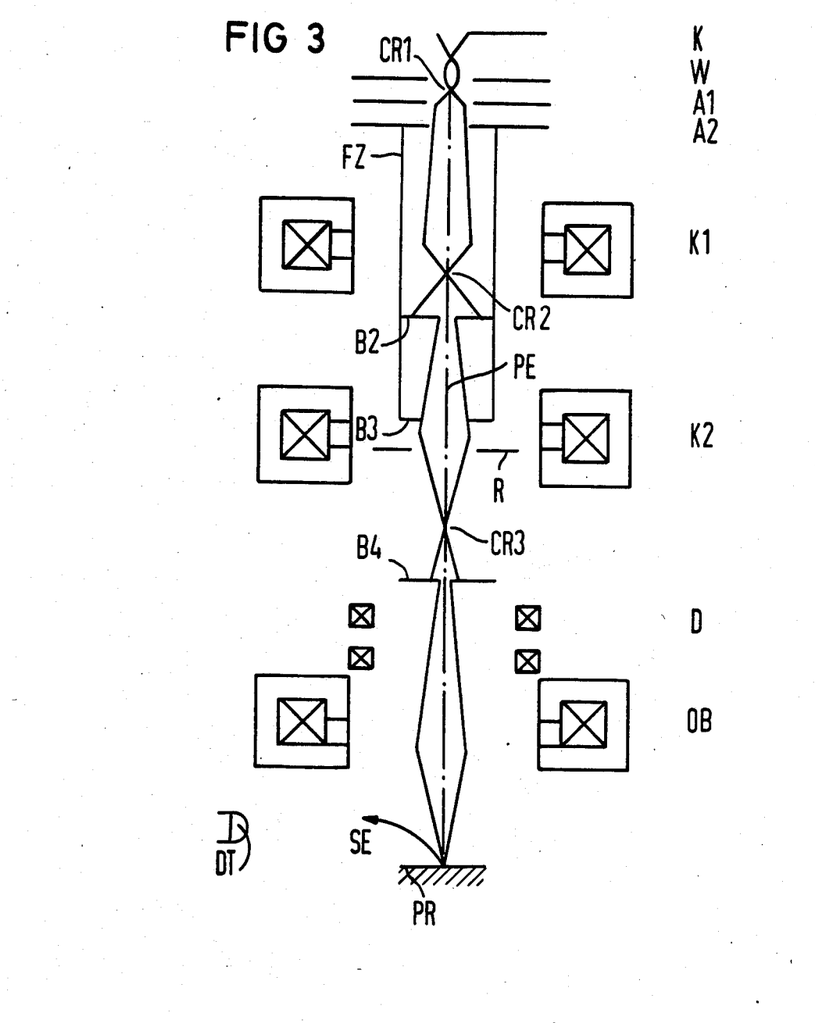

In the scanning electron microscope of FIG. 2, the retardation of the primary electrons to the desired ultimate energy occurs between the condenser lens K2 and the objective lens OB. When the scanning electron microscope is equipped with only a single condenser lens then, in an analogous exemplary embodiment, the decelerating electrode R is disposed between the condenser lens and the objective lens OB. In FIG. 3, the decelerating electrode R is integrated into one of the condenser lenses K2, or K3. In each of the embodiments shown in FIGS. 2 and 3, the beam crossover point CR3 lies at ground potential and is accessible. A beam blanking system can thus be installed in the region of the crossover point CR3.

Figure 4:
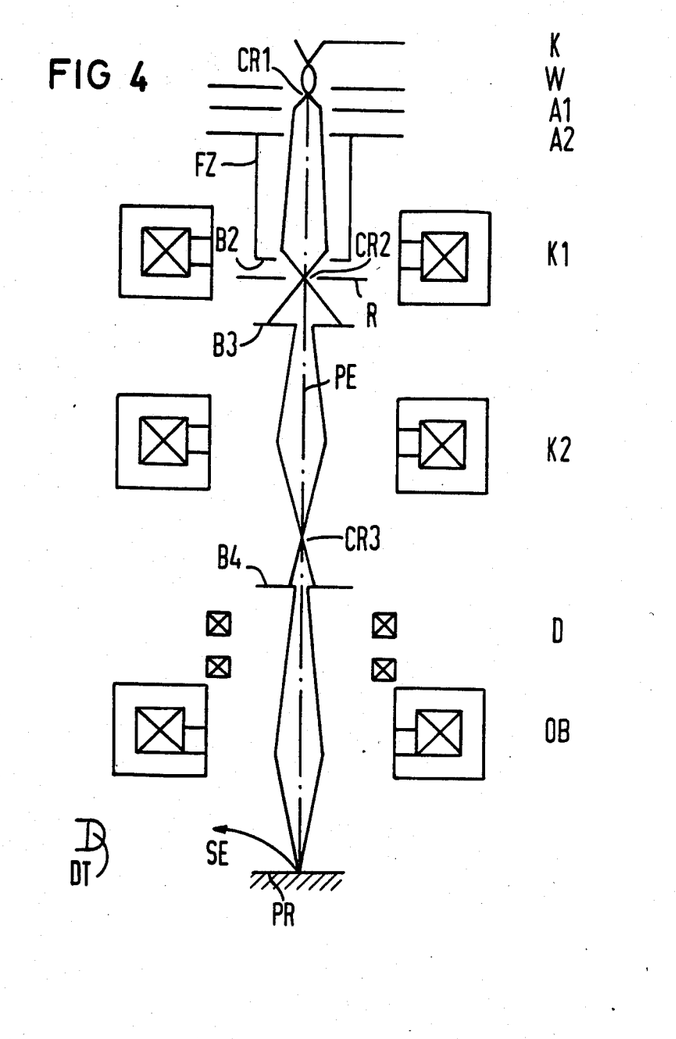

In FIG. 4, the electrons are decelerated between the condenser lenses K1 and K2 by the decelerating electrode R which is situated in the beam crossover point CR2 of the condenser lens K1. When a scanning electron microscope includes more than two condenser lenses, the decelerating electrodes can be disposed between two adjacent condenser lenses K1 and K2, within one condenser lens K1 or K2, or within the objective lens OB or following the objective lens OB in the beam direction.

Figure 5:
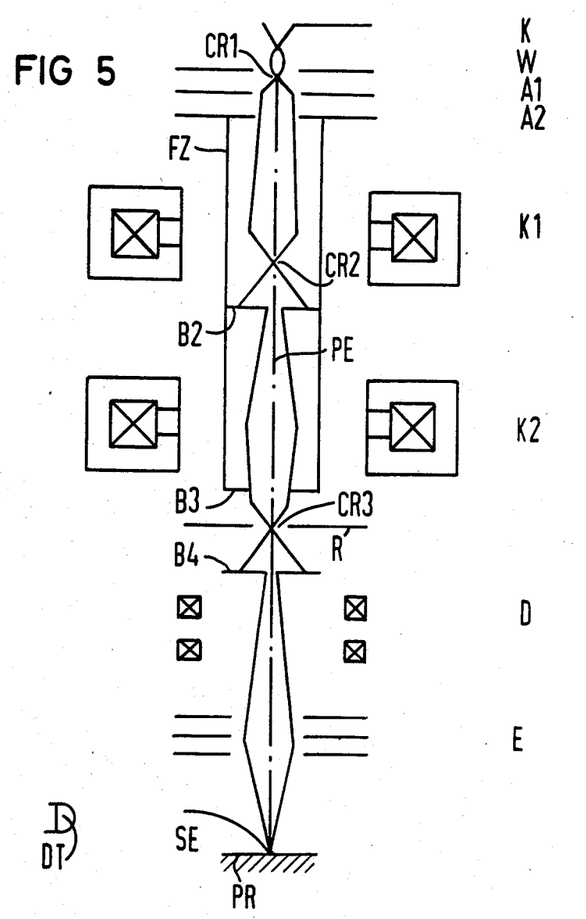

In the scanning electron microscope of FIG. 5, the objective lens OB is replaced by an electrostatic immersion lens E. Such focusing lens can be used simultaneously as a beam blanking system.

As the retarding point is shifted in the direction toward the electron source, the portion of the beam which the electrons traverse with a low ultimate energy is lengthened. Although the influence of the energetic Boersch effect in the beam generator still is reduced for the arrangements of FIGS. 2–5, the expansion of the electron probe diameter as a consequence of the lateral Boersch effect increases over the entire beam path proportional to the distance between the decelerating point and the specimen. Despite these disadvantages in comparison to the embodiment of FIG. 1, the current density given a prescribed probe diameter is significantly increased for the present invention in comparison to the prior art.

Figure 6:
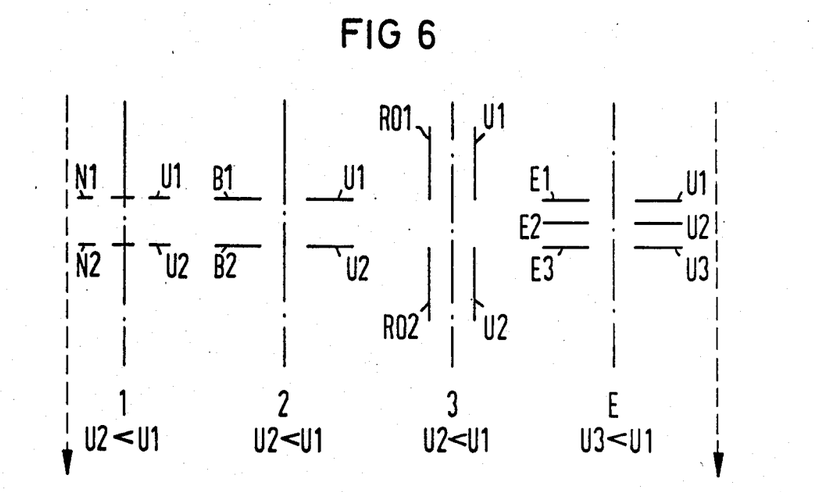
FIG. 6 is a schematic representation of electrode arrangements for deceleration of a primary electron beam in a scanning microscope of the present invention.

FIG. 6 shows various examples of devices R for retarding the high-energy primary electrons to the desired ultimate energy. Fundamentally, any electrostatic retarding device can be employed, particularly two-electrode or multi-electrode arrangements or combinations thereof. In the first arrangement, two series connected net-shaped electrodes N1 and N2 are provided, the net electrode N2 being closer to the specimen and lying at a lower potential than the net electrode N1. In the second electrode arrangement, diaphragms B1 and B2 exhibit lenslike properties. A third electrode arrangement is formed of two hollow cylinders RO1 or RO2. The hollow cylinder RO2 lies at a lower potential U2 than the hollow cylinder ROl. The fourth arrangement discloses a single electrostatic lens E for retarding the primary electrons, wherein the voltage of the electrode E3 is lower than the voltage of the electrode El. A potential U2, which is extremely negative in comparison to the potential U1, is applied to the middle electrode E2 for blanking the electron beam.

Although the present invention has been shown a d described with reference to a scanning electron microscope, it is also foreseen to utilize the principles thereof for all particle beam measuring instruments, particularly ion beam measuring instruments whose resolution is restricted by the Boersch effect.

As is apparent from the foregoing specification, the invention is susceptible to being embodied with various alterations and modifications which may differ particularly from those that have been described in the preceding specification and description. It should be understood that we wish to embody within the scope of the patent granted hereon all such modifications as reasonably and properly come within the scope of our contribution to the art.

We claim as our invention:

1. A scanning particle microscope, comprising:
a particle beam generator having a cathode and an extraction electrode disposed between a Wehnelt electrode and an anode for generating a particle beam of primary particles;
a beam-shaping lens system;
means for focusing and deflecting the particle beam onto a specimen;
at least one means for decelerating the primary particles in the beam path;
said extraction electrode being maintained at a first potential which is positive relative to the potential of said cathode; and
said anode being maintained at a second potential which is positive relative to the potential of said cathode, said second potential being greater than said first potential.

2. A scanning particle microscope as claimed in claim 1, wherein said second potential is a multiple of said first potential.

3. A scanning particle microscope as claimed in claim 1, wherein said focusing and deflecting means includes at least one magnetic lens and said decelerating means is disposed in said magnetic lens.

4. A scanning particle microscope as claimed in claim 1, wherein said means for decelerating includes an electrostatic lens.

5. A scanning particle microscope as claimed in claim 1, wherein said focusing and deflecting means includes a plurality of lenses, and said means for decelerating is disposed between two of said lenses.

6. A scanning particle microscope as claimed in claim 1, wherein said focusing and deflecting means includes a plurality of lenses, and said means for decelerating is disposed in the particle beam path following the last of said lenses.

7. A scanning particle microscope as claimed in claim 1, wherein said focusing and deflecting means includes an objective lens and said means for decelerating is disposed in the particle beam path preceding said objective lens.

8. A scanning particle microscope as claimed in claim 1, wherein said means for decelerating is formed of a two-electrode arrangement.

9. A scanning particle microscope as claimed in claim 1, wherein said means for decelerating is formed of a multi-electrode arrangement.

10. A scanning particle microscope as claimed in claim 1, wherein said means for decelerating is a net-shaped electrode.

11. A scanning particle microscope as claimed in claim 1, wherein said means for decelerating is a diaphragm.

12. A scanning particle microscope as claimed in claim 1, wherein said means for decelerating is a cylindrical lens.

13. A scanning particle microscope as claimed in claim 1, wherein said means for decelerating is a single lens.

14. A scanning particle microscope as claimed in claim 1, wherein said means for decelerating is formed of an electrostatic immersion lens.

15. An improved particle beam generator for use in a scanning particle microscope having means for shaping and deflecting a particle beam and means for retarding the particle beam prior to encountering a specimen, the improvement comprising:
a cathode at a first potential and defining a particle beam origin;
a Wehnelt electrode spaced from said cathode for generating a source crossover point in the particle beam;
an extraction electrode spaced from said Wehnelt electrode opposite said cathode and being at a second potential, said second potential being more positive than said first potential;
an anode spaced from said extraction electrode opposite said cathode and being at a third potential, said third potential being more positive than said first potential and of greater magnitude than said second potential.

16. A beam generator as claimed in claim 15, wherein said first and second potentials differ by 2 kV.

17. A beam generator as claimed in claim 15, wherein said first and third potentials differ by 10 kV.

18. A particle beam generator for use in a scanning particle microscope having a beam-shaping lens system, a means for focusing and deflecting a particle beam onto a specimen, and a means for decelerating beam particles prior to encountering a specimen, comprising mounted sequentially in the particle beam direction:
a cathode maintained at a cathode potential;
a Wehnelt electrode;
an extraction electrode maintained at an extraction potential which is positive relative to said cathode potential; and
an anode maintained at an anode potential which is positive relative to said cathode potential, said anode potential being greater in magnitude than said extraction potential.

19. A particle beam generator as claimed in claim 18, wherein said cathode potential is $-1$ kV, said extraction potential is $+1$ kV, and said anode potential is $+9$ kV.

20. A scanning particle microscope comprising:
means for generating a beam of primary particles including in the direction of beam generation:
a cathode,
a Wehnelt electrode,
an extractor electrode, and
an anode, said extraction electrode and said anode being maintained at a positive potential relative to said cathode, the potential of said anode being of substantially greater magnitude than the potential of said extraction electrode;
means for focusing and directing said beam of primary particles;
means for decelerating said beam of primary particles;
whereby said particles in the beam path are at relatively low energies before said extraction electrode and at relatively high energies after said extraction electrode.

* * * * *